(12) United States Patent
Itani et al.

(10) Patent No.: US 7,279,405 B2
(45) Date of Patent: Oct. 9, 2007

(54) FABRICATION METHOD FOR SEMICONDUCTOR DEVICE AND MANUFACTURING APPARATUS FOR THE SAME

(75) Inventors: Takaharu Itani, Kanagawa (JP); Takayuki Ito, Kanagawa (JP); Kyoichi Suguro, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 10/980,232

(22) Filed: Nov. 4, 2004

(65) Prior Publication Data

US 2005/0124123 A1    Jun. 9, 2005

(30) Foreign Application Priority Data

Nov. 6, 2003    (JP)    ............... P2003-376940

(51) Int. Cl.
 *H01L 21/425* (2006.01)
(52) U.S. Cl. .................. 438/530; 257/21.135
(58) Field of Classification Search ............ 438/197, 438/302, 350
See application file for complete search history.

(56) References Cited

U.S. PATENT DOCUMENTS

| 6,207,591 B1 * | 3/2001 | Aoki et al. | 438/795 |
| 6,770,519 B2 * | 8/2004 | Ito et al. | 438/197 |
| 2004/0018702 A1 * | 1/2004 | Ito et al. | 438/530 |

FOREIGN PATENT DOCUMENTS

| JP | 02-294027 | 12/1990 |
| JP | 03-068134 | 3/1991 |
| JP | 08-148677 | 6/1996 |
| JP | 2000-260710 | 9/2000 |
| JP | 2002-151428 | 5/2002 |
| JP | 2002-359192 | 12/2002 |
| JP | 2003-197631 | 7/2003 |
| JP | 2003-528462 | 9/2003 |
| JP | 2003-309079 | 10/2003 |
| JP | 2005-019515 | 1/2005 |

OTHER PUBLICATIONS

Notice of First Action mailed on Jan. 30, 2007, in counterpart Japanese Application No. 2003-376940.

* cited by examiner

*Primary Examiner*—Scott B. Geyer
*Assistant Examiner*—Elias Ullah
(74) *Attorney, Agent, or Firm*—Finnegan, Henderson, Farabow, Garrett & Dunner, L.L.P.

(57) ABSTRACT

A shallow p-n junction diffusion layer having a high activation rate of implanted ions, low resistivity, and a controlled leakage current is formed through annealing. Annealing after impurities have been doped is carried out through light irradiation. Those impurities are activated by annealing at least twice through light irradiation after doping impurities to a semiconductor substrate 11. The light radiations are characterized by usage of a W halogen lamp RTA or a flash lamp FLA except for the final light irradiation using a flash lamp FLA. Impurity diffusion maybe controlled to a minimum, and crystal defects, which have developed in an impurity doping process, may be sufficiently reduced when forming ion implanted layers in a source and a drain extension region of the MOSFET or ion implanted layers in a source and a drain region.

8 Claims, 12 Drawing Sheets

FIG. 10

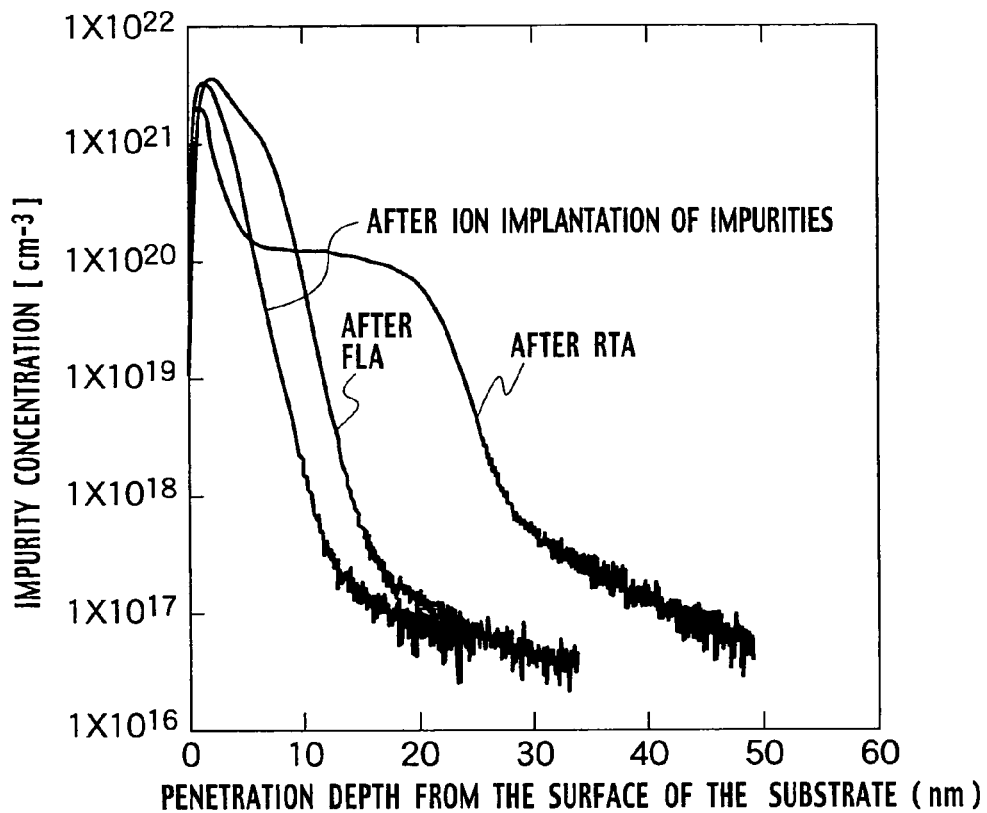

FIG. 11

| PROCESS | I | II | III | IV |
|---|---|---|---|---|
| ..... | ..... | ..... | ..... | ..... |
| IMPURITY DOPING PROCESS 1 | ION IMPLANTATION | ION IMPLANTATION | ION IMPLANTATION | ION IMPLANTATION |
| ANNEALING PROCESS FOR THE ACTIVATION OF IMPLANTED IONS 11 | NO | NO | FLA | FLA |
| ..... | ..... | ..... | ..... | ..... |
| IMPURITY DOPING PROCESS N | ION IMPLANTATION | ION IMPLANTATION | ION IMPLANTATION | ION IMPLANTATION |
| ANNEALING PROCESS FOR THE ACTIVATION OF IMPLANTED IONS N1 | FLA | RTA | RTA | RTA |
| ANNEALING PROCESS FOR THE ACTIVATION OF IMPLANTED IONS N2 | FLA | FLA | FLA | FLA |
| ANNEALING PROCESS FOR THE ACTIVATION OF IMPLANTED IONS N3 | NO | NO | NO | FLA |
| ..... | ..... | ..... | ..... | ..... |

FABRICATION METHOD FOR SEMICONDUCTOR DEVICE AND MANUFACTURING APPARATUS FOR THE SAME

CROSS REFERENCE TO RELATED APPLICATIONS

This application is based upon and claims the benefit of priority from the prior Japanese Patent Application No. P2003-376940 filed on Nov. 6, 2003, the entire contents of which are incorporated herein by reference.

BACKGROUND OF THE INVENTION

1. Field of the Invention

The present invention relates to a fabrication method for a semiconductor device and a manufacturing apparatus for the same.

2. Description of the Related Art

In order to improve large scale integrated circuit (LSI) performance, the integrated density or miniaturization of the elements used to configure an LSI has been enhanced. In order to miniaturize elements, reduction in the area of an impurity diffusion region as well as formation of a shallower diffusion region along the depth of the diffusion are required. For that purpose, it has become important to optimize ion implantation, which forms an impurity diffusion region such as a source and a drain region and a functional region such as a channel region just beneath a gate insulator layer, and the subsequent annealing process.

This annealing has been performed under conditions of, for example, 1000 Celsius (° C.) for 30 minutes. With such high-temperature and lengthy annealing time, impurity diffusion has occurred in addition to activation of impurities. In order to solve this problem, annealing should be performed for a minimum period of time to activate impurities with little diffusion. For example, rapid thermal annealing (RTA) using a tungsten (W) halogen lamp annealing under conditions of 1000 Celsius for approximately 10 seconds has been adopted. In recent years, a desired impurity profile cannot be obtained, since impurity diffusion occurs even after performing the annealing for a short time.

Therefore, adoption of a laser annealing method has been considered as a method of instantaneously providing a sufficient energy density required for activation. However, since a laser light inherently has high coherency and directivity, a multiphoton process or interference may occur. In addition, the original laser light has an energy density per time and per area that is too high. As a result, the surface of a silicon semiconductor substrate may melt or evaporated, or laser ablation may occur. Therefore, the morphology of a surface layer of a semiconductor substrate will be deteriorated after activation.

A flash lamp annealing (FLA) method using a flash lamp that includes gas such as xenon has been spotlighted as a means of improving the activation rate of impurities in an extremely short time in addition to the RTA or the laser annealing. Flash lamp annealing conditions are, for example, an electrical conduction time of 10 msec or less and an irradiation energy density of 100 J/cm$^2$ or less. FLA has received attention as a new annealing method that can control and activate impurity diffusion simultaneously without causing any secondary deteriorating effects as with the laser annealing.

A method of annealing a wafer to a specific temperature using a first lamp such as a halogen lamp, and then irradiating and annealing that wafer using a second lamp such as a flash lamp, that is, a method of annealing a wafer using two types of lamps, each of which lights for a different irradiation time, has been suggested as described in Japanese Patent Application Laid-Open No. 2002-151428. In addition, a method of performing a first lamp annealing process with higher energy density than the band gap of an amorphous semiconductor film, and performing a second lamp annealing process with an energy density greater than the band gap of a monocrystal semiconductor film and less than the band gap of an amorphous semiconductor film, that is, a method of changing a lamp wavelength according to the band gap of a semiconductor layer has been disclosed as described in Japanese Patent Application Laid-Open No. 2000-260710.

Miniaturization of elements and reduction in element dimension are important results of formation of a shallow source and a drain diffusion region or a shallow source and a drain extension diffusion region. As a method of doping impurities to a shallow region, both ion implantation at low acceleration energy density and subsequent short-time RTA processing have been adopted. Nevertheless, once the RTA processing is performed even only for several tens of seconds after ion implantation of boron (B), which is conventionally-used as the p-type dopant, and phosphorus (P) or arsenic (As) as the n-type dopant, diffusion may occur deep in the substrate since a silicon (Si) substrate has a high diffusion factor. In addition, when the annealing temperature is reduced, there is a problem that the activation rate of impurities drastically declines. Accordingly, it is difficult to form a shallow impurity diffusion layer with a junction depth of less than 50 nm and with low resistivity.

In recent years, the above-mentioned FLA has been spotlighted as a means of improving the activation rate in an extremely short time. Employment of FLA allows control of impurity diffusion and formation of an extremely shallow junction. However, with FLA which performs annealing in a matter of milliseconds, it is difficult to sufficiently fix crystal defects, which are developed in the semiconductor substrate during the ion implantation process. Immediately after the ion implantation process, a crystal structure in a region where dopant is implanted in the semiconductor substrate is partially damaged and turns into an amorphous layer. This amorphous layer must be re-crystallized with, for example, subsequent annealing. If a large amount of crystal defects remain in, for example, the source and the drain region, those crystal defects may develope into a conductive path. This may cause an increase in leakage current during transistor operation, resulting in deterioration in the characteristics. On the other hand, in the case of annealing with RTA, annealing is performed at least for several seconds. If that annealing is performed until reaching the temperature capable of activating impurities, for example, 1020 Celsius, the high temperature is maintainted for at least several seconds and a heat energy density sufficient for re-growth of crystals can be obtained. Therefore, the crystal defects can be fixed. However, in this case, it is difficult to form a shallow junction since the impurities will deeply diffuse.

SUMMARY OF THE INVENTION

An aspect of the present invention inheres in a fabrication method for a semiconductor device including a plurality of impurity doping processes and a plurality of annealing processes, including: a first and a subsequent or final impurity doping; annealing for activation through a first light irradiation after the final impurity doping; and annealing for activation through a second light irradiation after the annealing for activation through the first light irradiation.

Another aspect of the present invention inheres in a fabrication method for a semiconductor device including a plurality of impurity doping processes and a plurality of annealing processes, including: a first and a subsequent or final impurity doping; annealing for activation through a first light irradiation after the final impurity doping; and a final flash lamp annealing for activation after a plurality of annealing for activation through a plurality of light irradiation including the first light irradiation.

Another aspect of the present invention inheres in a fabrication method for a semiconductor device, including: forming the device isolation regions on the semiconductor substrate; forming a gate electrode in the device regions, which is partitioned by the device isolation regions, via a gate insulator layer; forming impurity ion implanted layers in the source and the drain extension region using the gate electrode as a mask; depositing a silicon oxide film on the surface of the substrate at a low temperature; removing excessive silicon oxide film from the semiconductor substrate; processing the substrate so that the silicon oxide film remains only on a sidewalls of the gate electrode; forming impurity ion implanted layers in the source and the drain region using the gate electrode and the silicon oxide film remaining on the sidewalls thereof as a mask; performing a first annealing for the semiconductor substrate by light irradiation using a flash lamp with a first energy density after forming the impurity ion implanted layers in the source and the drain region; and performing a second annealing for the semiconductor substrate by light irradiation using a flash lamp with a second energy density after performing the first annealing.

Another aspect of the present invention inheres in a fabrication method for a semiconductor device, including: forming the device isolation regions on the semiconductor substrate; forming a gate electrode in the device regions, which is partitioned by the device isolation regions, via a gate insulator layer; forming impurity ion implanted layers in the source and the drain extension region using the gate electrode as a mask; depositing a silicon oxide layer on the surface of the substrate at a low temperature; removing excessive silicon oxide film from the semiconductor substrate; processing the substrate so that the silicon oxide film remains only on a sidewalls of the gate electrode; forming impurity ion implanted layers in the source and the drain region using the gate electrode and the silicon oxide film remaining on the sidewalls thereof as a mask; performing a first annealing for the semiconductor substrate using a tungsten halogen lamp after formation of the impurity ion implanted layers in the source and the drain region; and performing a second annealing for the semiconductor substrate using a flash lamp after performing the first annealing.

Another aspect of the present invention inheres in a manufacturing apparatus for a semiconductor device including: an air-controlled substrate transport chamber; a substrate receiving/discharging block coupled to the substrate transport chamber; an FLA process chamber coupled to the substrate transport chamber to perform annealing using a flash lamp; and an RTA process chamber coupled to the substrate transport chamber to perform annealing using a halogen lamp.

BRIEF DESCRIPTION OF THE DRAWINGS

FIG. 10 is a comparative diagram showing profiles of impurity concentration versus penetration depth from the surface of a semiconductor substrate when annealing is performed for an ion-implanted semiconductor substrate using an RTA apparatus and an FLA apparatus, respectively;

FIG. 11 is a comparative diagram showing a part of a plurality of impurity doping and a plurality of annealing for activation of implanted ions in the semiconductor device fabrication method according to the first through fourth embodiments of the present invention;

DETAILED DESCRIPTION OF THE INVENTION

Figure 1:
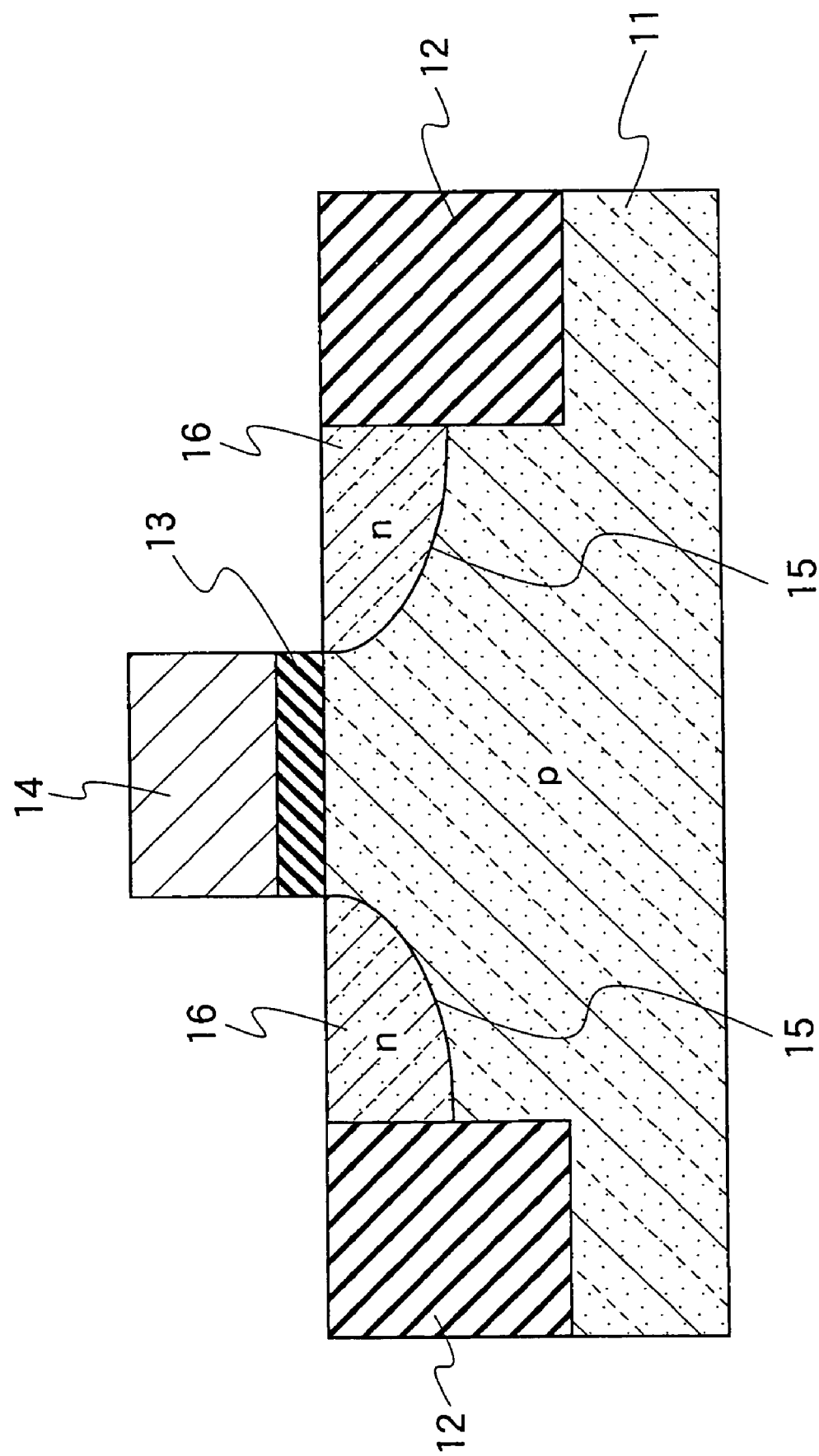
FIG. 1 is a schematic cross-sectional device structure for describing a process of semiconductor device fabrication method according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

The embodiments of the present invention provides a semiconductor device fabrication method and a semiconductor manufacturing apparatus that allow sufficient activation of impurities doped in a semiconductor substrate without deep diffusion of impurities and formation of a shallow diffusion layer with low resistivity in which crystal defects in the semiconductor substrate are sufficiently repaired.

According to the embodiments of the present invention, impurity diffusion may be controlled to a minimum, and crystal defects, which are developed through an impurity doping process, may be reduced sufficiently. As a result, a shallow p-n junction with low resistivity and a controlled leakage current may be formed.

Annealing after impurities have been doped is carried out by light irradiation. Those impurities are activated by annealing at least twice by light irradiation after doping impurities to a semiconductor substrate. More specifically, the impurities doped in the semiconductor substrate are activated by irradiating light using a W halogen lamp or a flash lamp under conditions so that those impurities cannot be diffused and the crystal defects are reduced before a final light irradiation and, finally, irradiating light using a flash lamp. The embodiments are characterized in that light irradiation except for the final light irradiation is performed using a W-halogen lamp or a flash lamp and the final light irradiation is performed using a flash lamp.

FIRST EMBODIMENT

Figure 5:
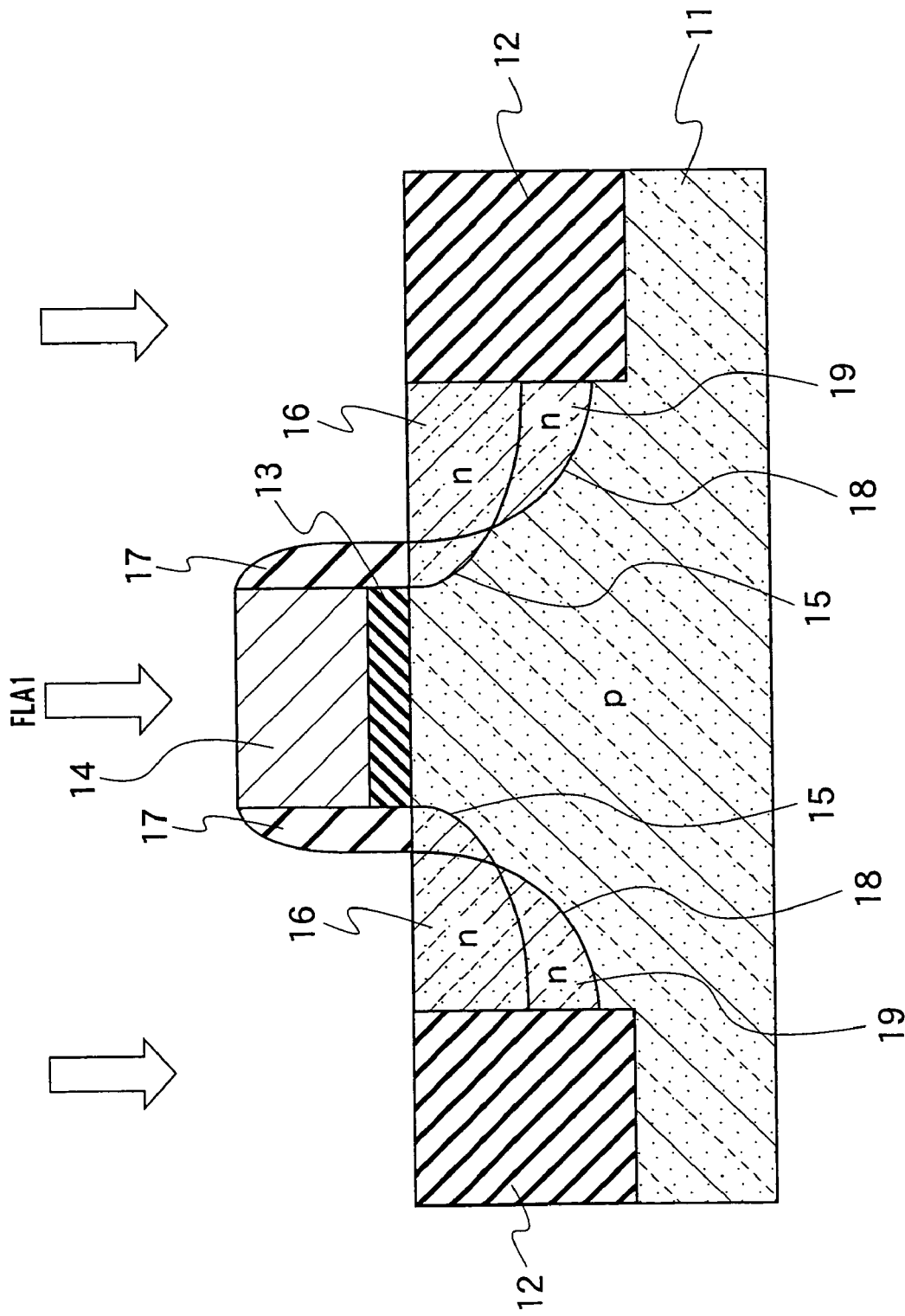
FIG. 5 is a schematic cross-sectional device structure for describing a process of a semiconductor device fabrication method according to the first embodiment of the present invention.
Figure 6:
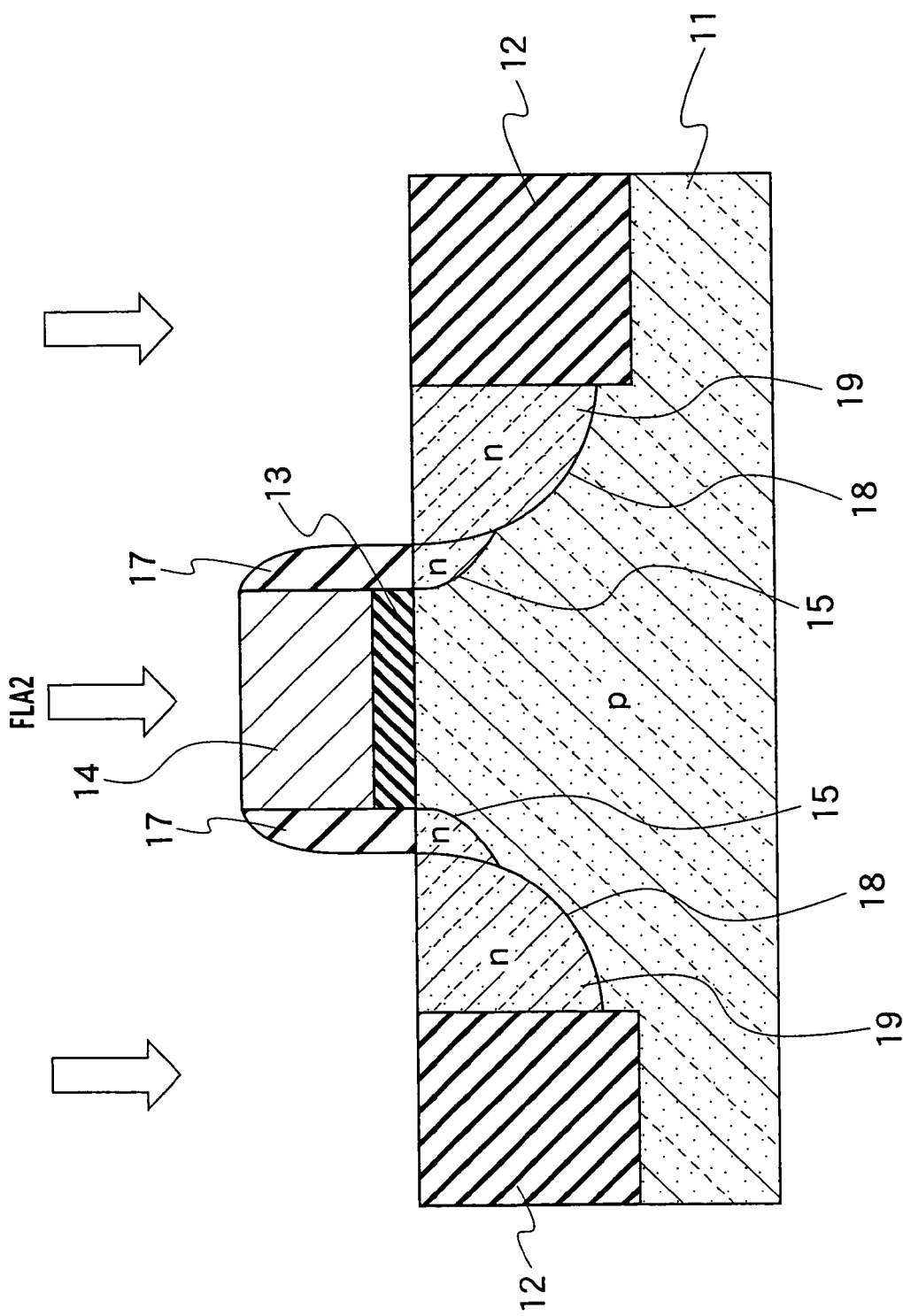
FIG. 6 is a schematic cross-sectional device structure for describing a process of a semiconductor device fabrication method according to the first embodiment of the present invention.

A semiconductor device manufactured using a semiconductor device fabrication method according to a first embodiment of the present invention is, for example, a metal oxide semiconductor (MOS) field effect transistor, as shown in FIG. 6, configured with a semiconductor substrate 11, device isolation regions 12, a source and a drain region 18, a source and a drain extension region 15, a gate insulator layer 13, a gate electrode 14, and silicon oxide films 17, which are disposed on the sidewalls of the gate electrode 14. In FIG. 6, a source and a drain electrode are omitted. FIGS. 1 through 6 are cross-sectional process diagrams for describing a semiconductor device fabrication method according to the first embodiment of the present invention.

To begin with, the device isolation regions 12 formed with STIs (shallow trench isolation) or the like are formed on the semiconductor substrate 11 made of, for example, a monocrystalline silicon using an ordinary MOS transistor fabrication method, and a gate electrode 14 made of a polycrystalline silicon or the like is then formed in each device region, which is partitioned by the device isolation regions 12, via a gate insulator layer 13 through photolithography and a dry etching method.

Figure 2:
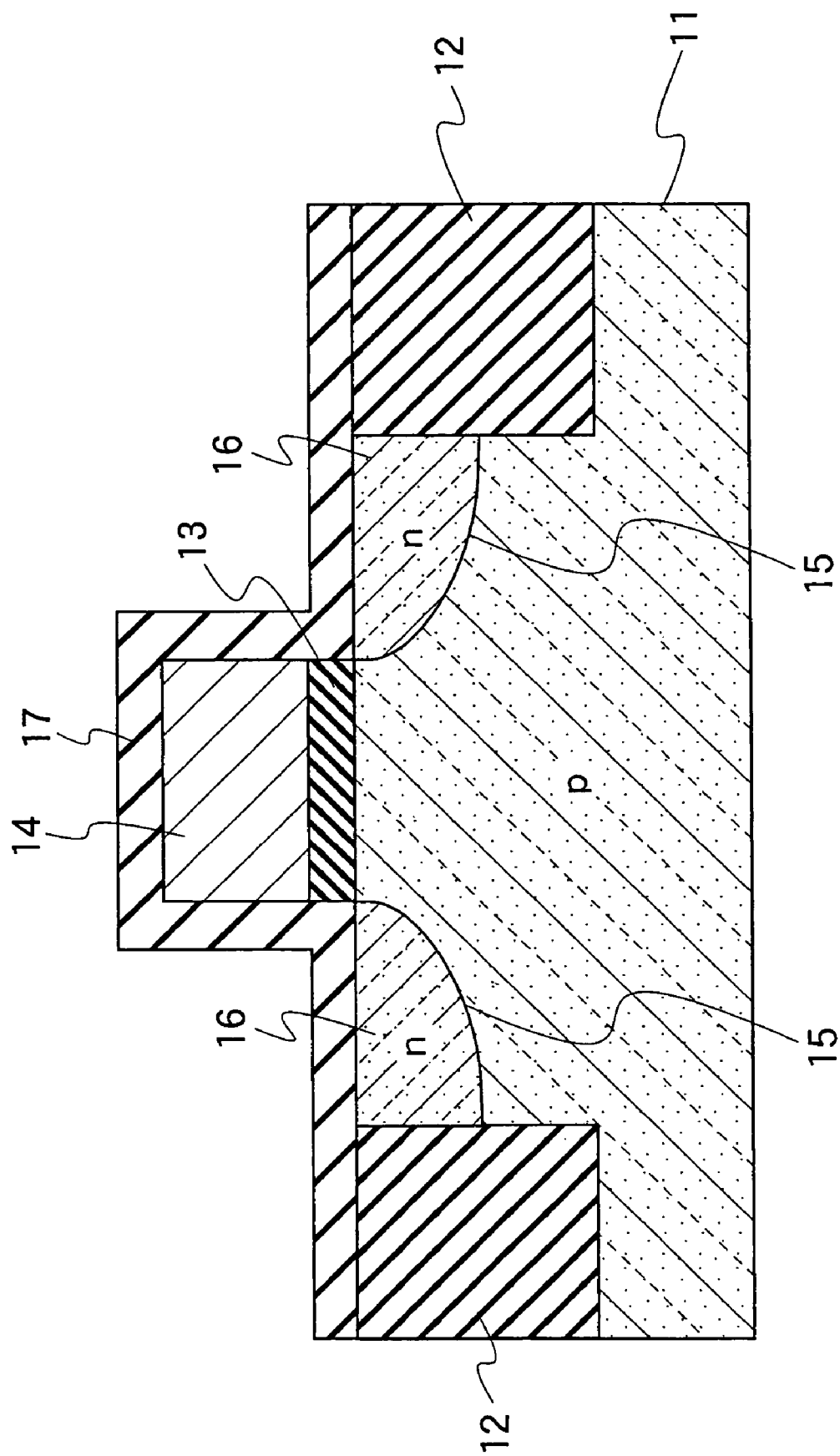
FIG. 2 is a schematic cross-sectional device structure for describing a process of a semiconductor device fabrication method according to the first embodiment of the present invention.

Ion impurity implanted layers 16 are then formed in the source and the drain extension region 15 using the gate electrode 14 as a mask (FIG. 1). Boron (B), and either phosphorus (P) or arsenic (As) are used as the p-type and n-type dopant, respectively, which are implanted in the source and the drain extension region 15. Subsequently, a silicon oxide ($SiO_2$) film 17 of approximately 20 nm is deposited at a temperature of approximately 600 Celsius using a low-pressure CVD (LPCVD) method (FIG. 2). Alternatively, the silicon oxide film 17 may be deposited using a plasma CVD method or a coating method. In this case, it is necessary to form a film at a low temperature of approximately 700 Celsius or less so as to prevent impurities from being incompletely activated in the semiconductor substrate 11 when forming the silicon oxide film 17.

Figure 3:
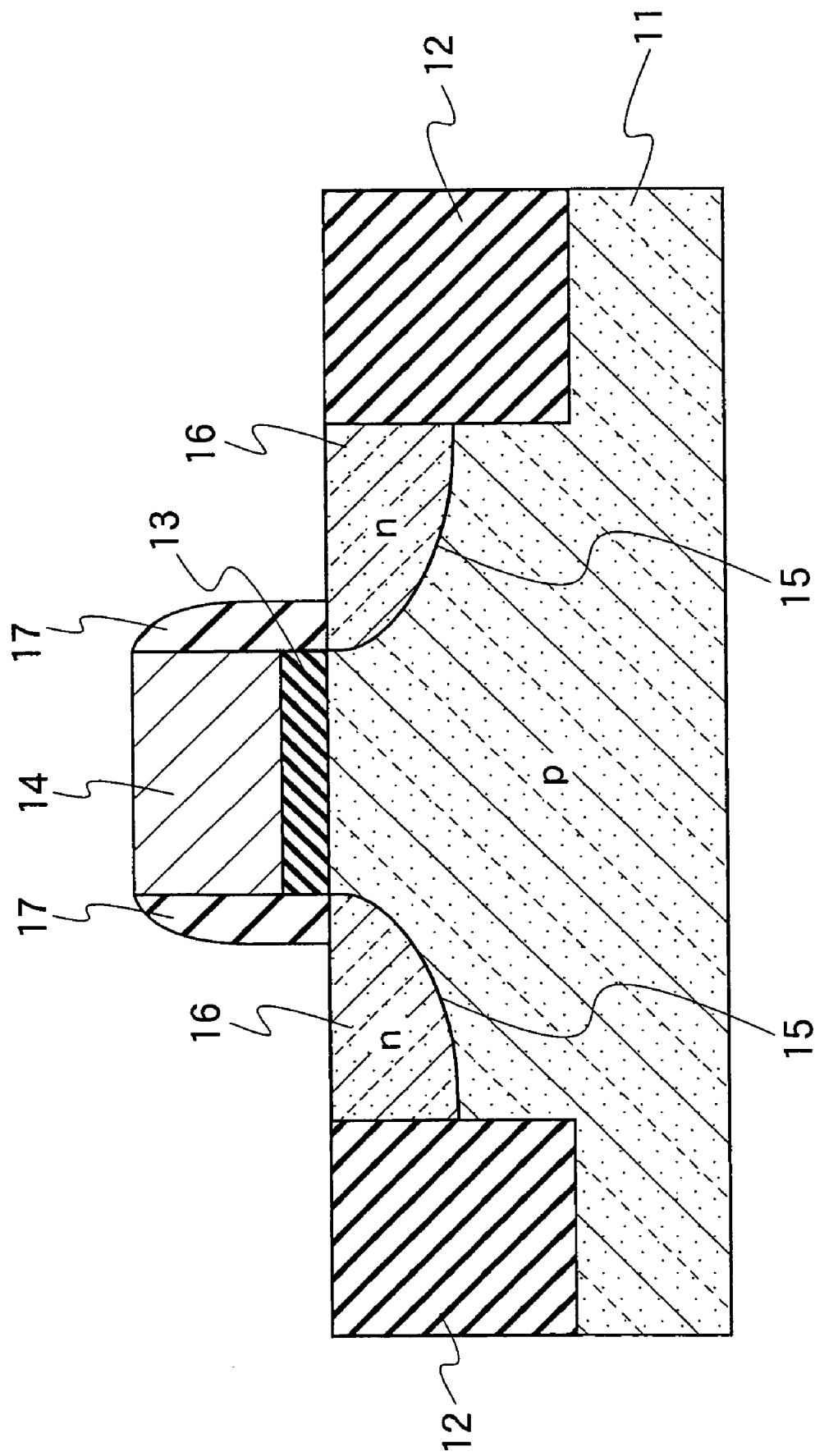
FIG. 3 is a schematic cross-sectional device structure for describing a process of a semiconductor device fabrication method according to the first embodiment of the present invention.

An excessive part of the silicon oxide film 17 on the semiconductor substrate 11 is removed using a dry etching method or the like and fabricated so as to remain only on the sidewalls of the gate electrode 14 (FIG. 3).

Figure 4:
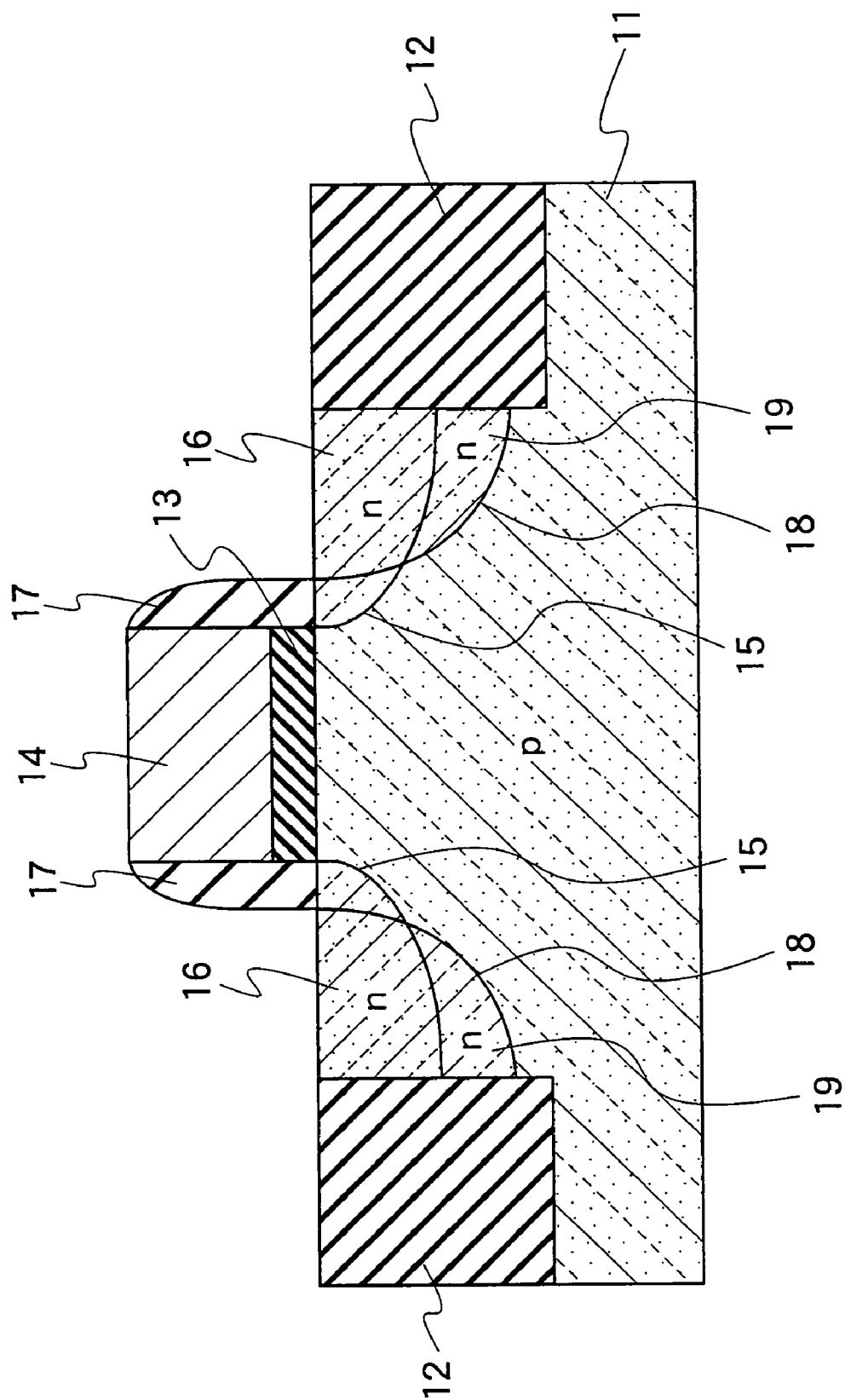
FIG. 4 is a schematic cross-sectional device structure for describing a process of a semiconductor device fabrication method according to the first embodiment of the present invention.

Under the foregoing condition, impurity ion implanted regions 19 are formed in the source and the drain region 18 using the gate electrode 14 and the silicon oxide films 17 remaining on the sidewall thereof as a mask (FIG. 4). Boron (B), and either phosphorus (P) or arsenic (As) are used as the p-type and n-type dopant, respectively. The ion implantation conditions are, for example, an acceleration energy of 20 keV and a dosage of $5 \times 10^{15}$ ions/$cm^2$.

A first annealing (FLA) is performed for the semiconductor substrate using a flash lamp to perform a first impurity activation. In this case, the first irradiation is performed under conditions where a preheating temperature is 400 Celsius and the irradiation energy density is 24 J/$cm^2$ (FIG. 5).

Furthermore, a second annealing (FLA) is performed for the semiconductor substrate using a flash lamp to perform a second impurity activation so as to complete that the source and the drain region 18 and the source and the drain extension region 15. In this case, the second irradiation is performed under conditions where a preheating temperature is 450° C. and the irradiation energy density is 28 J/$cm^2$ (FIG. 6).

An objective of preheating the semiconductor substrate 11 is to reduce stress developed therein. More specifically, the first surface of the semiconductor substrate, which is irradiated by the flash lamp, is rapidly heated to a high temperature; whereas the interior of the semiconductor substrate and the second (opposite) surface relative to the irradiated first surface or the under surface of the semiconductor substrate 11 are heated to a lower temperature. As a result, stress is developed in the semiconductor substrate 11. Thus, the objective is to reduce this stress. A MOS transistor is formed on the semiconductor substrate by depositing or forming an interlayer insulator film and a contact electrode using a conventional transistor formation method.

Figure 7:
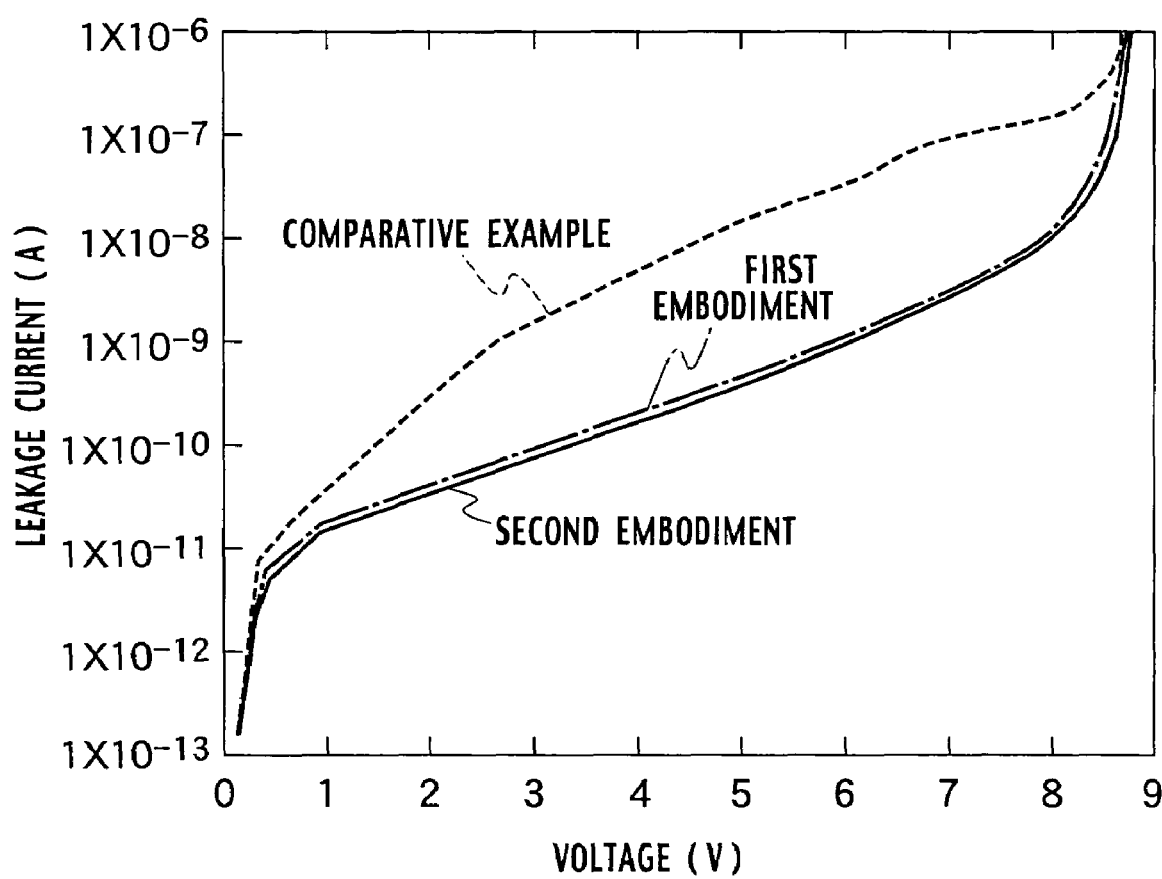
FIG. 7 is a graph illustrating a relationship between a leakage current and a voltage.

FIG. 7 shows that the leakage current flowing between the semiconductor substrate 11 and the source and the drain region 18 of the MOS transistor, which are formed according to the first embodiment of the present invention, depends on the applied voltage. FIG. 7 also shows that the leakage current depends on the applied voltage in the case of annealing being performed only once using the RTA in place of the first FLA, but the second FLA is not performed, as a comparative example. In addition, FIG. 7 also shows the case of a second embodiment, which is described later. In the first embodiment, the amount of the leakage current flowing between the semiconductor substrate 11 and the source and the drain region 18 of the MOS transistor is lower than that for the comparative example. Although not shown in FIG. 7, in the first embodiment, the amount of the leakage current is equivalent to the case of continuing to perform annealing using the RTA etc. until the crystal defects are sufficiently repaired. On the other hand, as a result of evaluating the profile of the impurity concentration in the source and the drain extension region 15, the junction depth is controlled to approximately 20 nm, which is appropriate for a minute MOS transistor.

In the first embodiment, the irradiation energy density of the first FLA irradiation (FIG. 5) after ion implantation in the source and the drain region 18 is set to be lower than that of the second FLA irradiation (FIG. 6). The first FLA irradiation conditions provide a low impurity activation rate; however, since the diffusion is controlled, the depth profile immediately after ion implantation barely changes. On the other hand, since the energy density required for repairing the crystal defects in the semiconductor substrate 11 is lower than that required for activating impurities, even low irradiation energy density allows re-arrangement and crystallization of the atoms of the substrate and reduction in the crystal defects. Next, in the second FLA irradiation, impurities are sufficiently activated by increasing the irradiation energy density, and at the same time the crystal defects in the semiconductor substrate 11 further decreases, resulting in almost complete recovery of crystallization.

With the semiconductor device fabrication method according to the first embodiment as shown in FIG. 11 that is described later, annealing process for the activation of implanted ions (11) is not performed immediately after impurity doping process (ion implantation) 1, but FLA processing is performed twice under different conditions after impurity doping process (ion implantation) N as shown in the annealing process for the activation of implanted ions (N1) and (N2). In the first embodiment, annealing using the FLA is repeated twice after the final impurity doping process N. Performing FLA processing twice facilitates re-crystallization of the crystal defects, which have developed in the substrate due to ion implantation in the impurity doping. In addition, it allows control and activation of impurity diffusion.

SECOND EMBODIMENT

Figure 8:
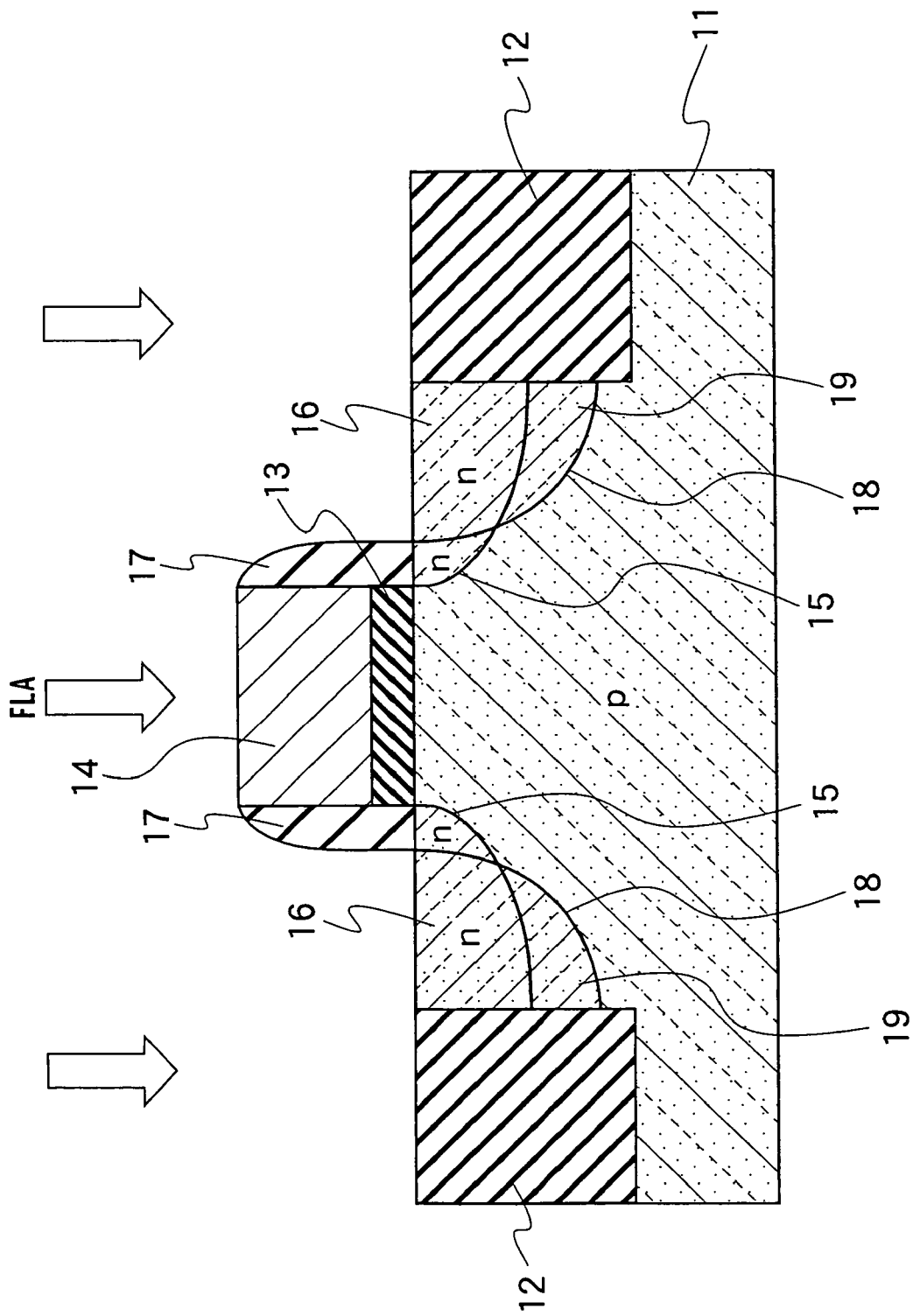
FIG. 8 is a schematic cross-sectional device structure for describing a process of a semiconductor device fabrication method according to a second embodiment of the present invention.

A semiconductor device manufactured using a semiconductor device fabrication method according to a second embodiment of the present invention is a MOS field effect transistor, which is configured with a semiconductor substrate 11, device isolation regions 12, a source and a drain region 18, a source and a drain extension region 15, a gate insulator layer 13, a gate electrode 14, silicon oxide films 17 disposed on the sidewalls of the gate electrode 14, and ion implanted layers 16 and 19, as shown in FIG. 8, for example. In FIG. 8, a source and a drain electrode are omitted. The structure shown in FIG. 8 is substantially the same as that shown in FIG. 6. However, since RTA processing is performed in place of the first FLA, a higher activation rate of the implanted ions in the ion implanted layers 16 and 19 is expected. A diffusion layer tends to extend deeper due to the RTA processing.

The semiconductor device fabrication method according to the second embodiment of the present invention is described forthwith clarifying differences from the first embodiment.

The impurity ion implanted layers 19 are formed in the source and the drain region 18 through the same process as the first embodiment shown in FIGS. 1 through 6 (FIG. 4).

Next, annealing process for the activation of implanted ions is performed as follows. To begin with, RTA processing is performed using a tungsten (W) halogen lamp (FIG. 8). The RTA conditions are a temperature of approximately 800 to 900 Celsius, and a high-temperature maintaining time of approximately 5 to 10 seconds. If the temperature is too high, impurities in the ion implanted layers 16 formed in the source and the drain extension region 15 diffuse unnecessarily; on the contrary, if the temperature is too low, crystal defects cannot be reduced. Therefore, it is desirable that the temperature should be approximately 700 to 900 Celsius.

Next, FLA processing is performed under irradiation conditions where a preheating temperature is 450 Celsius and the irradiation energy density is 28 J/cm$^2$ (FIG. 6). This light irradiation allows control and activation of impurity diffusion to complete the source and the drain region 18 and the source and the drain extension region 15.

According to the second embodiment, at first, light irradiation using a W halogen lamp (RTA) is performed under conditions for recovering the crystallization without diffusion of impurities so as to reduce crystal defects, and annealing is then carried out using the FLA under conditions for activating impurities so as to reduce the crystal defects and recover the crystallization of the semiconductor substrate 11.

As shown by a dot-dashed line and a solid line in FIG. 7, as with the first embodiment (dot-dashed line), the leakage current flowing at the p-n junction of the semiconductor substrate 11 and the source and the drain region 18 of the MOS transistor according to the second embodiment (solid line) has been controlled to be less than that of the comparative example shown by a dotted line. Moreover, according to the second embodiment, the leakage current is equivalent to the case of continuing to perform annealing processing using the RTA or the like until the substrate is sufficiently crystallized. Furthermore, the junction depth of the source and the drain extension region 15 is controlled to be approximately 20 nm, which allows formation of minute MOS transistors.

Figure 9:
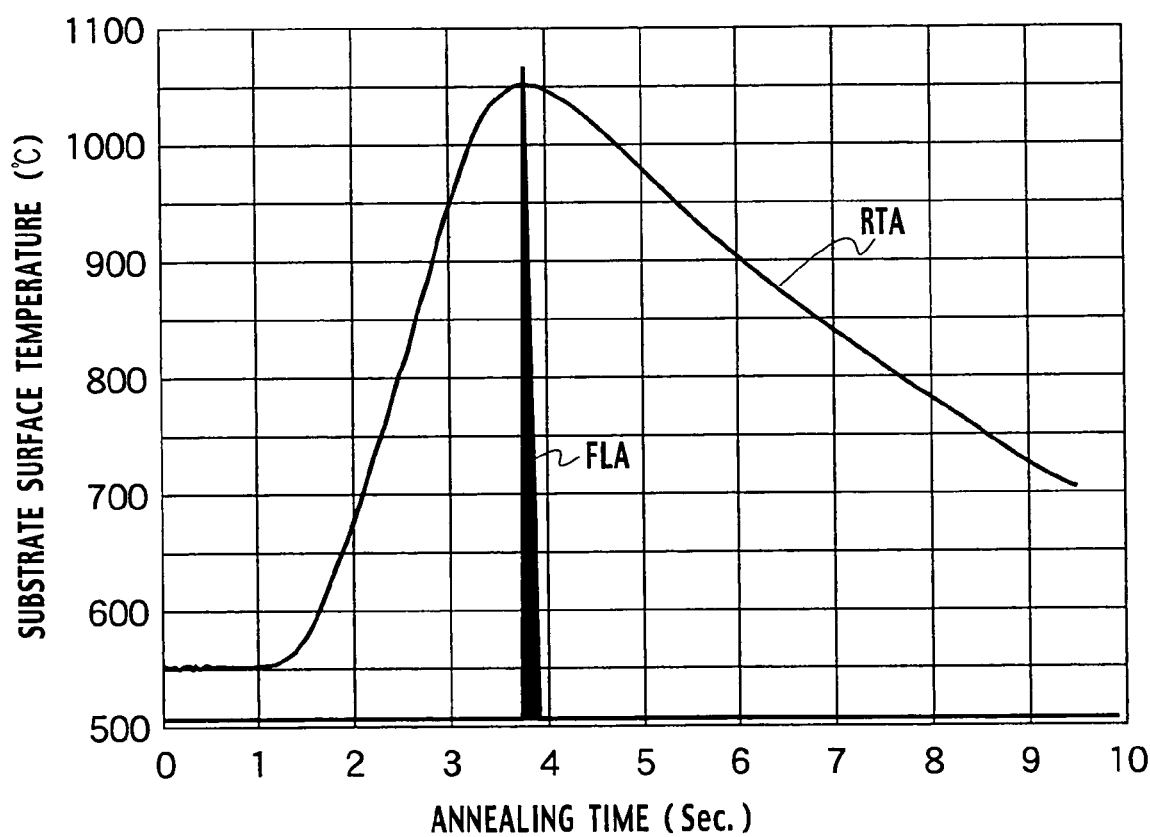
FIG. 9 is a comparative diagram showing a profile of a substrate surface temperature over time when annealing is performed for a substrate using an RTA apparatus and a profile of a substrate surface temperature over time when annealing is performed for a substrate using an FLA apparatus.

FIG. 9 shows a profile of a substrate surface temperature over time when a substrate is subjected to annealing using an RTA apparatus that uses a halogen lamp as a heating source and a profile of a substrate surface temperature over time when a substrate is subjected to annealing using an FLA apparatus. As is apparent from FIG. 9, the RTA apparatus takes 7 to 8 seconds to increase a temperature of 700 Celsius to 1000 Celsius and then decrease it to 700 Celsius. By contrast, the FLA apparatus takes 0.5 seconds or less to complete increasing and then decreasing the temperature. With the FLA apparatus, since temperature increases and decreases extremely fast, the period that the substrate temperature stays high during the cycle of increasing and decreasing is extremely short. Since impurity diffusion depth in the semiconductor substrate 11 corresponds to the product of the impurity diffusion factor times the period during which a certain temperature allowing diffusion with that diffusion factor is maintained, it is possible to control impurity diffusion in the semiconductor substrate 11 by performing annealing using the FLA apparatus that takes a short time to increase and decrease the temperature. At the same time, activation of impurities can be enhanced since the attained temperature of the semiconductor substrate 11 is maintained as with the RTA apparatus.

FIG. 10 shows measurement results of impurity concentration in the semiconductor substrate 11 along the depth once the ion-implanted semiconductor substrate 11 is subjected to annealing using the RTA apparatus and the FLA apparatus, respectively. The ion implantation conditions are that the impurities are phosphorus ions and the acceleration energy during implantation is 1 kilo electron volt (keV). Measurement is performed using secondary ion mass spectrometry (SIMS).

In FIG. 10, the impurity concentration profile immediately after impurities have been doped is an analyzed result of the ion implanted semiconductor substrate 11, which is not subjected to any additional processing. 'After FLA' indicates the impurity concentration profile after the ion implanted semiconductor substrate 11 has been subjected to the FLA processing; and 'after RTA' indicates the impurity concentration profile after the ion implanted semiconductor substrate 11 has been subjected to the RTA processing.

FIG. 10 shows that the RTA processing has provided high impurity concentrations in deeper positions of the semiconductor substrate 11, that is, impurities have diffused deeply. Meanwhile, after FLA processing, only slight changes from the concentration curve F have occured, which is obtained immediately after ion implantation and reveals that the diffusion is well controlled. Use of the FLA apparatus in this way allows control and activation of diffusion.

FIG. 11 shows comparison results between a part of impurity doping processes 1 through N and annealing processes for the activation of implanted ions (11), . . . , (N1), . . . , (N3) accompanied with the impurity doping processes according to the semiconductor device fabrication method of the first and the second embodiment of the present invention. In FIG. 11, the columns denote processes, and the rows denote the first and the second embodiment (I) and (II). The third and the fourth embodiment (III) and (IV), which are described later, are also shown in FIG. 11 for comparison. In addition, processing methods used for respective processes in the left column are described in the respective columns of embodiments. FIG. 11 shows a process including N number of impurity doping processes, which are used to fabricate a semiconductor device. Here, 'impurity doping process N' represents the Nth impurity doping process. Therefore, 'impurity doping process n' represents the nth impurity doping process, where n denotes a number from 1 to N.

With the semiconductor device fabrication method according to the second embodiment, annealing process for the activation of implanted ions (11) is not performed immediately after the impurity doping process (ion implantation) 1, but RTA processing and FLA processing are performed once with different conditions, respectively, after the impurity doping process (ion implantation) N, as shown in the annealing processes for the activation of implanted ions (N1) and (N2). In the second embodiment, the RTA processing is performed after the final impurity doping process N, and the FLA processing is then performed. To begin with, re-crystallization of the crystal defects in the substrate is facilitated to a certain degree through the RTA processing. Afterwards, impurity activation is performed through the FLA processing, which allows control and activation of diffusion.

On the other hand, as a comparative example not shown in the drawing, there is a method of performing the RTA processing only once after the impurity doping process (ion implantation) N; wherein that method does not perform annealing process for the activation of implanted ions (11) immediately after the impurity doping process (ion implantation) 1. Alternatively, as another comparative example, there is a method of performing the RTA processing in the annealing process for the activation of implanted ions (11), which begins immediately after the impurity doping process (ion implantation) 1, and further performing the RTA processing a second time after the impurity doping process (ion implantation) N.

With the semiconductor device fabrication method according to the second embodiment, (i) a shallow diffusion layer can be formed and a layer damaged due to defects can be removed by performing the FLA processing several times. Alternatively, (ii) a damaged layer can be repaired by performing the RTA processing only once at a low temperature, and the activation rate can be enhanced while maintaining the shallow diffusion layer by performing the FLA processing. The low-temperature RTA may take, for example, a temperature of 700 to 900 Celsius, and FLA processing may be performed several times.

Figure 12:
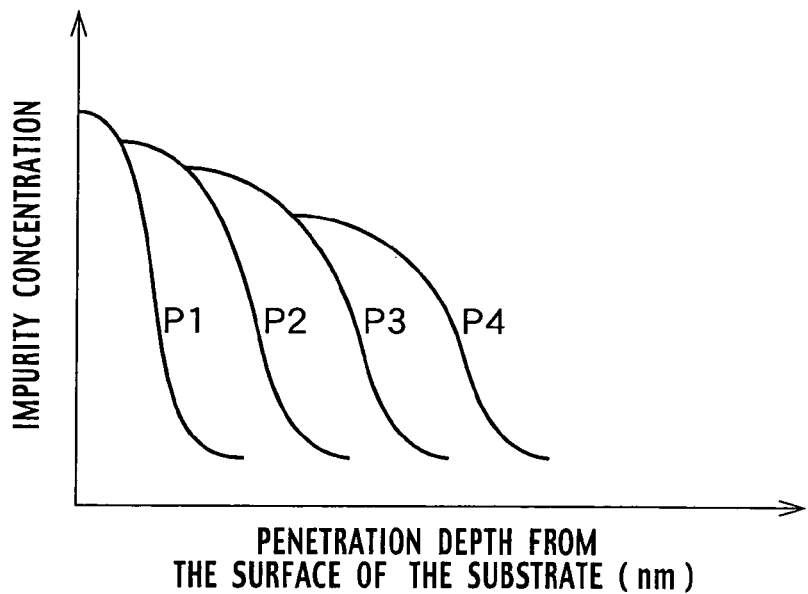
FIG. 12 is a schematic diagram showing an impurity concentration profile shifting deeper from the surface of a substrate when FLA with high energy density is performed several times.

When the FLA processing is performed several times with a high energy density, each impurity concentration profile shifts along the depth from the substrate surface, as shown by profiles P1 through P4 in FIG. 12. Therefore, the irradiation energy density should be controlled to be relatively low so that each impurity concentration profile cannot shift. At this time, it is also possible to repair the crystal defects. Higher irradiation energy density easily causes an increase in temperature, facilitating diffusion. Accordingly, it is possible to increase the activation rate by controlling the irradiation energy density to be low, and in the subsequent process performing RTA processing once, which sets a high temperature. Alternatively, the FLA processing may be performed once or several times in place of the RTA processing.

THIRD EMBODIMENT

As with the second embodiment, a semiconductor device manufactured using a semiconductor device fabrication method according to a third embodiment of the present invention is a MOS field effect transistor, which is configured with a semiconductor substrate 11, device isolation regions 12, a source and a drain region 18, a source and a drain extension region 15, a gate insulator layer 13, a gate electrode 14, silicon oxide films 17, which are disposed on the sidewalls of the gate electrode 14, and ion implanted layers 16 and 19, as shown in FIG. 8, for example. In FIG. 8, a source and a drain electrode are omitted. In the third embodiment, as shown in FIG. 11, since the first FLA processing is performed in the annealing process for the activation of implanted ions (11), which begins immediately after the impurity doping process 1, a higher activation rate of implanted ions with the impurity doping process 1 is expected. The structure shown in FIG. 8 is substantially the same as that shown in FIG. 6. However, in comparison with the first embodiment, since the RTA processing is performed in place of the FLA processing immediately after the impurity doping process N, a higher activation rate of the implanted ions in the ion implanted layers 16 and 19 is expected. Meanwhile, the diffusion layer tends to extend deeper due to the RTA processing.

A semiconductor device fabrication method according to the third embodiment of the present invention may be implemented by the processes shown in column III of FIG. 11.

The first FLA processing is performed in the annealing process for the activation of implanted ions (11), which begins immediately after impurity doping process (ion implantation) 1. The setting of the first FLA processing conditions is the same as that for FLA processing in the annealing process for the activation of implanted ions (N1) or (N2) according to the first embodiment, for example.

RTA processing is performed after the final impurity doping process (ion implantation) N as shown in the annealing process for the activation of implanted ions (N1). To begin with, re-crystallization of the crystal defects in the substrate is facilitated to a certain degree through the RTA processing. The RTA processing conditions in this case are the same as those of the second embodiment.

Next, the second FLA processing is performed as shown in the annealing process for the activation of implanted ions (N2). The impurity activation performed through the second FLA processing allows control and activation of diffusion. The second FLA processing conditions are the same as those of the second embodiment.

The third embodiment is characterized in that the activation process using an FLA is performed after each of a plurality of ion implantation processes. The impurity activation performed through the FLA processing after each ion implantation process allows control and activation of diffusion.

Alternatively, the activation process using an FLA may be performed after each of a plurality of ion implantation processes. By performing the FLA processing after the nth ion implantation process n, impurity diffusion may be controlled, and crystal defects, which have developed in the ion implantation process n, may be fixed to a certain degree. Subsequently, the RTA processing may be performed after the final ion implantation process N to repair the crystal defects, which have developed in the ion implantation processes N and n, and afterwards activation may be performed through the FLA processing.

FOURTH EMBODIMENT

As with the second or the third embodiment, a semiconductor device manufactured using a semiconductor device fabrication method according to a fourth embodiment of the present invention is a MOS field effect transistor, which is configuredwith a semiconductor substrate 11, device isolation regions 12, a source and a drain region 18, a source and a drain extension region 15, a gate insulator layer 13, agate electrode 14, silicon oxide films 17, which are disposed on the sidewalls of the gate electrode 14, and ion implanted layers 16 and 19, as shown in FIG. 8 for example. In FIG. 8, a source and a drain electrode are omitted. In the fourth embodiment, as shown in FIG. 11, since the first FLA processing is performed in the annealing process for the activation of implanted ions (11), which begins immediately after the impurity doping process 1, a higher activation rate of implanted ions with the impurity doping process 1 is expected. The structure shown in FIG. 8 is substantially the same as that shown in FIG. 6. However, in comparison with the first embodiment, since RTA processing is performed in place of the FLA, which begins immediately after the impurity doping process N, a higher activation rate of the implanted ions in the ion implanted layers 16 and 19 is expected. Meanwhile, the diffusion layer tends to extend deeper due to the RTA processing. Furthermore, in the fourth embodiment, as shown in FIG. 11, since the third FLA processing is performed in the annealing process for the activation of implanted ions (N3), a higher activation rate of implanted ions in the ion implanted layers 16 and 19 is expected, as compared the rate with the third embodiment.

The semiconductor device fabrication method according to the fourth embodiment of the present invention may be implemented by the processes shown in column IV of FIG. 11.

Immediately after the impurity doping process (ion implantation) 1, the first FLA processing is performed in the annealing process for the activation of implanted ions (11).

RTA processing is performed in the annealing process for the activation of implanted ions (N1), which begins after the final impurity doping process (ion implantation) N. To begin with, re-crystallization of the crystal defects in the substrate is facilitated to a certain degree through the RTA processing.

Next, the second FLA processing is performed in the annealing process for the activation of implanted ions (N2).

Next, the third FLA processing is performed in the annealing process for the activation of implanted ions (N3). The impurity activation performed through the second and the third FLA processing allows control and activation of diffusion.

The fourth embodiment is characterized in that the activation process using an FLA is performed after each of a plurality of ion implantation processes, and/or FLA processing is preformed several times consecutively. The impurity activation performed through the FLA processing after each ion implantation process allows control and activation of diffusion. The setting of the RTA and the FLA processing conditions in the annealing processes for the activation of implanted ions (N1) and (N2) are the same as that of with the second and the third embodiment. In addition, the setting of conditions for subsequent second and third FLA processing may be the same as that of the first embodiment. In addition, the setting of the first FLA processing conditions may be the same as that of the third embodiment.

Like the fourth embodiment, the RTA processing may be performed after the final ion implantation process N to facilitate repair of crystal defects to a certain degree, and afterwards the FLA processing may be repeated to further repair the crystal defects and perform activation.

With any of the first to the fourth embodiment, in comparison with the RTA processing, a shallow junction may be formed by further controlling diffusion; the activation rate is equivalent to that for the RTA processing; and crystal defects, which have developed during ion implantation, can be repaired.

Semiconductor Manufacturing Apparatus

Figure 13:
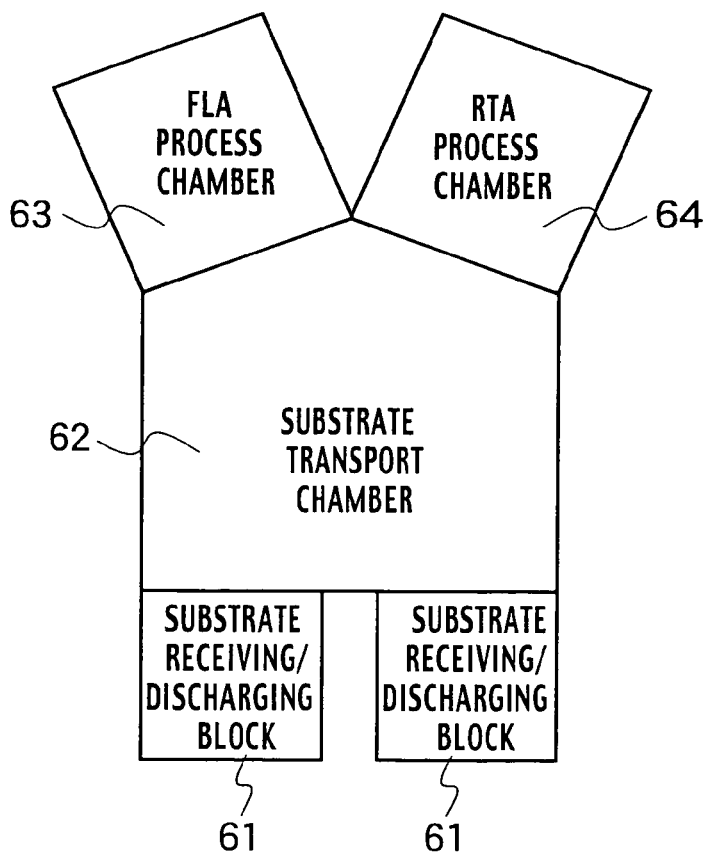
FIG. 13 is an aerial structure showing a schematic structure of a semiconductor manufacturing apparatus using a semiconductor device fabrication method of the present invention.
Figure 14:
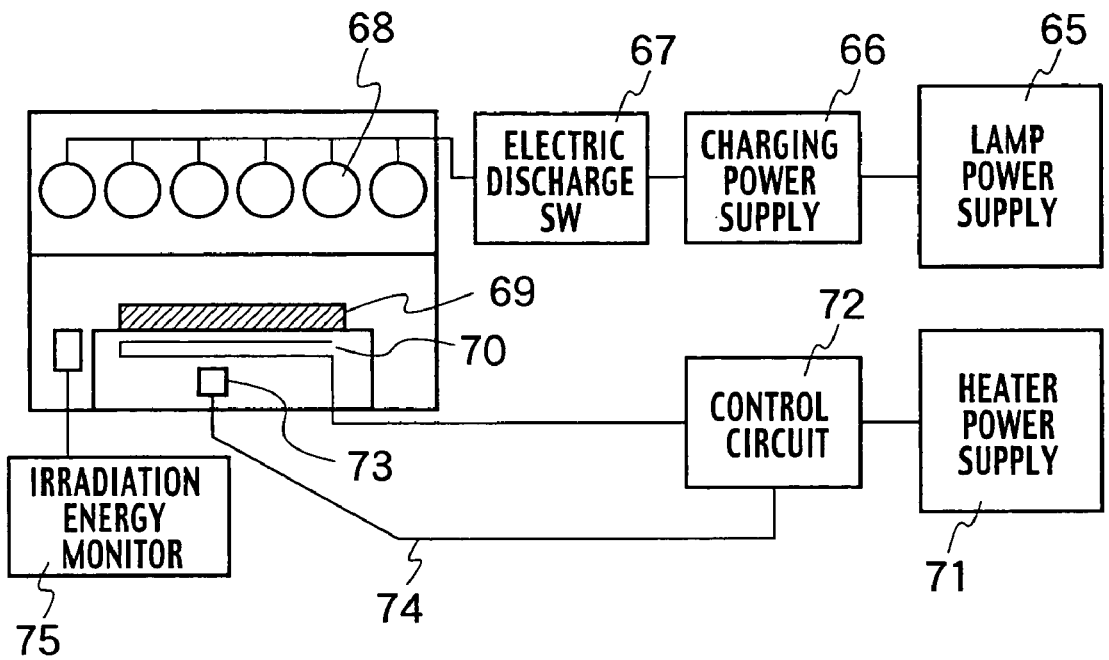
FIG. 14 is a schematic structure of an FLA apparatus showing a schematic structure of a semiconductor manufacturing apparatus using a semiconductor device fabrication method of the present invention.
Figure 15:
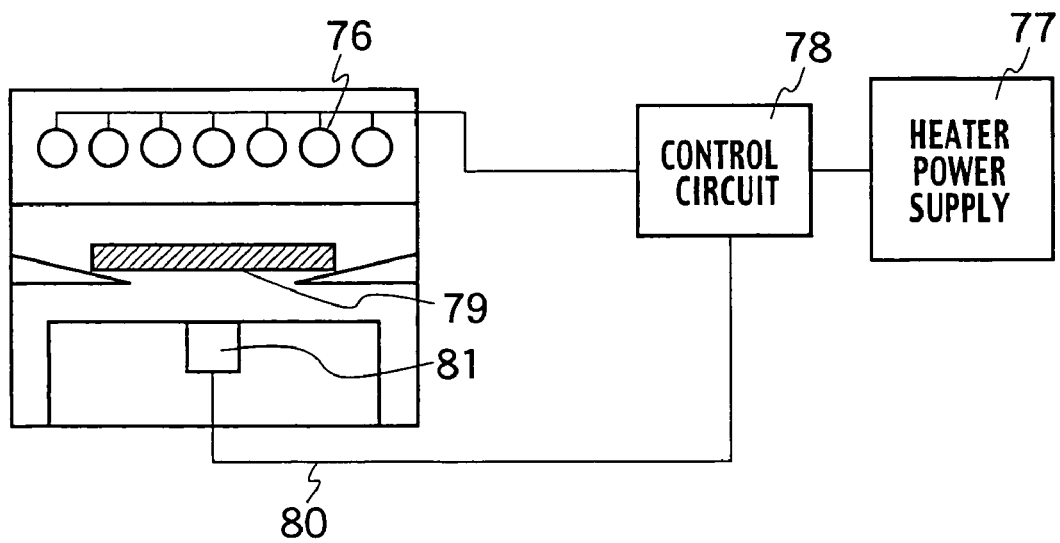
FIG. 15 is a schematic structure of an RTA apparatus showing a schematic structure of a semiconductor manufacturing apparatus using a semiconductor device fabrication method of the present invention.

FIGS. 13 through 15 show schematic diagrams of a semiconductor manufacturing apparatus used for a semiconductor device fabrication method of the present invention. FIG. 13 is a schematic plan view of the semiconductor manufacturing apparatus, which is configured with a substrate receiving/discharging block 61, an air-controlled substrate transport chamber 62, an FLA process chamber 63 and an RTA process chamber 64, which perform FLA processing and RTA processing, respectively.

FLA Apparatus

FIG. 14 shows a schematic diagram of an FLA apparatus. A flash lamp 68 irradiates a substrate under the control of a lamp power supply 65, a charging power supply 66, and a discharging switch 67. An irradiation energy monitor 75, which monitors energy density irradiated from the lamp, may be provided. A substrate preheating mechanism is configured with a heater 70, which is arranged in a table that mounts a substrate 69, a control circuit 72, and a heater power supply 71, and further includes a temperature monitor 73 and a feedback control loop 74, which contribute to stabilization of the heater 70 to provide a desired temperature.

RTA Apparatus

FIG. 15 shows a schematic diagram of an RTA apparatus. A halogen lamp 76 is turned on under the control of a heater power supply 77, a control circuit 78 and related circuits. The temperature of a substrate 79 is measured by a temperature monitor 81, and the control circuit 78 has a feedback control loop 80, which allows the temperature to reach a desired level. Use of the manufacturing apparatus of the present invention allows the FLA or the RTA apparatus to easily perform annealing several times consecutively.

OTHER EMBODIMENTS

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A fabrication method for a semiconductor device including a plurality of impurity doping processes and a plurality of annealing processes, comprising:

a first and a subsequent or final impurity doping;

annealing for activation through a first light irradiation after the final impurity doping; and annealing for activation through a second light irradiation after the annealing for activation through the first light irradiation; wherein:

the first and the second light irradiations are provided by a flash lamp, and an irradiation energy density of the flash lamp in the second light irradiation is higher than an irradiation energy density of the flash lamp in the first light irradiation.

2. The fabrication method for a semiconductor device of claim 1, further comprising:

annealing for activation through a third light irradiation after the first impurity doping, before the annealing for activation through the first and the second light irradiation.

3. The fabrication method for a semiconductor device of claim 2, further comprising:

annealing for activation through a fourth light irradiation after the annealing through the second light irradiation.

4. The fabrication method for a semiconductor device of claim 2, wherein, the annealing through the third light irradiation is provided by a flash lamp.

5. A fabrication method for a semiconductor device including a plurality of impurity doping processes and a plurality of annealing processes, comprising:

a first and a subsequent or final impurity doping;

annealing for activation through a first light irradiation after the final impurity doping; and a final flash lamp annealing for activation after a plurality of annealing for the activation through a plurality of light irradiation including the first light irradiation; wherein:

the first light irradiation is provided by a flash lamp, and an irradiation energy density of the flash lamp in the final annealing is higher than an irradiation energy density of the flash lamp in the first light irradiation.

6. A fabrication method for a semiconductor device, comprising:

forming device isolation regions on the semiconductor substrate;

forming a gate electrode in device regions, which are partitioned by the device isolation regions, via a gate insulator layer;

forming impurity ion implanted layers in source and drain extension regions using the gate electrode as a mask;

depositing a silicon oxide film on a surface of the substrate at a low temperature;

removing excessive silicon oxide film from the semiconductor substrate;

processing the substrate so that the silicon oxide film remains only on sidewalls of the gate electrode;

forming impurity ion implanted layers in the source and the drain regions using the gate electrode and the silicon oxide film remaining on the sidewalls thereof as a mask;

performing a first annealing for the semiconductor substrate by light irradiation using a flash lamp with a first energy density after forming the impurity ion implanted layers in the source and the drain regions; and performing a second annealing for the semiconductor substrate by light irradiation using a flash lamp with a second energy density after performing the first annealing;

wherein the first energy density in the first annealing is lower than the second energy density in the second annealing.

7. The fabrication method for a semiconductor device of claim 6, wherein, the first and the second annealing further include preheating the semiconductor substrate.

8. The fabrication method for a semiconductor device of claim 6, wherein, the first and the second annealing further include preheating the semiconductor substrate.

* * * * *